United States Patent
Dobashi et al.

(10) Patent No.: US 10,181,446 B2
(45) Date of Patent: Jan. 15, 2019

(54) CAMERA MODULE, IMAGING APPARATUS, AND ELECTRONIC INSTRUMENT

(71) Applicant: SONY CORPORATION, Tokyo (JP)

(72) Inventors: Eiichiro Dobashi, Kumamoto (JP); Takahiro Wakabayashi, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 1 day.

(21) Appl. No.: 15/527,780

(22) PCT Filed: Nov. 13, 2015

(86) PCT No.: PCT/JP2015/082001
§ 371 (c)(1),
(2) Date: May 18, 2017

(87) PCT Pub. No.: WO2016/084632
PCT Pub. Date: Jun. 2, 2016

(65) Prior Publication Data
US 2017/0330847 A1  Nov. 16, 2017

(30) Foreign Application Priority Data

Nov. 27, 2014 (JP) .................................. 2014-240054
Sep. 9, 2015 (JP) .................................. 2015-177857

(51) Int. Cl.
*H01L 27/14* (2006.01)
*H01L 23/00* (2006.01)
(Continued)

(52) U.S. Cl.
CPC ................ *H01L 24/04* (2013.01); *G02B 7/02* (2013.01); *G02B 13/16* (2013.01); *H01L 27/14* (2013.01);
(Continued)

(58) Field of Classification Search
CPC ........................................................ H01L 27/14
See application file for complete search history.

(56) References Cited

U.S. PATENT DOCUMENTS 5,506,401 A * 4/1996 Segawa ............. H01L 27/14618
  250/208.1
5,786,589 A * 7/1998 Segawa ............. H01L 27/14618
  250/208.1

(Continued)

FOREIGN PATENT DOCUMENTS

JP  07-099214 A  4/1995
JP  2005-072978 A  3/2005

(Continued)

*Primary Examiner* — Eugene Lee
(74) *Attorney, Agent, or Firm* — Chip Law Group

(57) ABSTRACT

The present technology relates to a camera module capable of reducing the number of steps in the manufacturing process and reducing a black spot failure, a method for manufacturing the camera module, an imaging apparatus, and an electronic instrument. A frame and the rigid flexible substrate are adhered to each other by adhesive formed of thermosetting resin applied on an abutment surface excluding a portion of a range including a bonding section with the FPC drawer unit, thereby forming a vent hole in a site where adhesive has not been applied. At this time, the air of the space between the frame and the rigid flexible substrate is expanded by the heat and discharged from the vent hole. Subsequently, after adhesion is performed with thermosetting resin, reinforcement resin that reinforces the bonding section between the rigid flexible substrate and the FPC drawer unit or that reinforces the bonding section between the rigid flexible substrate and the frame is applied so as to close a portion of the range on which the adhesive has not been applied. This enables omitting the process of closing the vent hole. The present technology can be applied to a camera module.

13 Claims, 17 Drawing Sheets

(51) Int. Cl.
  *G02B 7/02*    (2006.01)
  *H01L 27/146*  (2006.01)
  *H04N 5/225*   (2006.01)
  *G02B 13/16*   (2006.01)

(52) U.S. Cl.
  CPC ....... *H01L 27/14683* (2013.01); *H04N 5/225* (2013.01); *H04N 5/2257* (2013.01)

(56) References Cited

U.S. PATENT DOCUMENTS

| | | | | |
|---|---|---|---|---|
| 6,813,103 | B2* | 11/2004 | Tansho | G02B 7/022 |
| | | | | 257/E31.117 |
| 7,405,764 | B2* | 7/2008 | Gustavsson | G02B 13/0015 |
| | | | | 257/433 |
| 7,534,645 | B2* | 5/2009 | Choi | H01L 27/14618 |
| | | | | 257/E21.503 |
| 2001/0050717 | A1* | 12/2001 | Yamada | H01L 27/14618 |
| | | | | 348/340 |
| 2001/0055073 | A1* | 12/2001 | Shinomiya | H01L 27/14618 |
| | | | | 348/374 |
| 2003/0025825 | A1* | 2/2003 | Nakajoh | H01L 27/14618 |
| | | | | 348/374 |
| 2006/0091487 | A1* | 5/2006 | Hanada | H01L 24/03 |
| | | | | 257/432 |
| 2006/0146170 | A1* | 7/2006 | Saito | G02B 27/0006 |
| | | | | 348/340 |
| 2010/0103296 | A1* | 4/2010 | Nakagiri | H01L 27/14618 |
| | | | | 348/294 |
| 2013/0194388 | A1* | 8/2013 | Busse | H04N 13/02 |
| | | | | 348/46 |

FOREIGN PATENT DOCUMENTS

| | | |
|---|---|---|
| JP | 2007-335507 A | 12/2007 |
| JP | 2008-312104 A | 12/2008 |

\* cited by examiner

CAMERA MODULE, IMAGING APPARATUS, AND ELECTRONIC INSTRUMENT

CROSS REFERENCE TO RELATED APPLICATIONS

This application is a U.S. National Phase of International Patent Application No. PCT/JP2015/082001 filed on Nov. 13, 2015, which claims priority benefit of Japanese Patent Application No. JP 2014-240054 filed in the Japan Patent Office on Nov. 27, 2014 and also claims priority benefit of Japanese Patent Application No. JP 2015-177857 filed in the Japan Patent Office on Sep. 9, 2015. Each of the above-referenced applications is hereby incorporated herein by reference in its entirety.

TECHNICAL FIELD

The present technology relates to a camera module, a method for manufacturing the camera module, an imaging apparatus, and an electronic instrument and relates particularly to the camera module capable of reducing the number of steps in the manufacturing process and reducing a black spot failure, a method for manufacturing the camera module, an imaging apparatus, and an electronic instrument.

BACKGROUND ART

When a frame equipped with an infrared ray cut filter (IRCF) is bonded with a rigid flexible substrate including a solid-state imaging element in constituting a semiconductor apparatus such as a camera module, adhesive formed of thermosetting resin is used for a bonding surface between the frame and the rigid flexible substrate.

At adhesion, heating is performed in a state where the adhesive-applied surfaces are bonded with each other, and the adhesive is cured, thereby adhering the frame and the rigid flexible substrate to each other.

Meanwhile, since the gas of the space between the frame and the rigid flexible substrate is expanded at heating, a vent hole is provided to escape the expanded gas. After adhesion is completed, curable resin is applied separately to close this vent hole (refer to Patent Document 1).

CITATION LIST

Patent Document

Patent Document 1: JP 2007-335507 A

SUMMARY OF THE INVENTION

Problems to be Solved by the Invention

The technique in Patent Document 1, however, separately needs a process of closing the vent hole after curing of the thermosetting resin applied on the adhesion surface between the frame and the rigid flexible substrate in an adhesion process.

The present technology is made in view of this circumstance and intended to achieve reduction in the number of steps in the manufacturing process and achieve prevention of stain deposition on the imaging element by closing the vent hole without separately requiring a process for closing the vent hole.

Solutions to Problems

A camera module according to one aspect of the present technology includes:

a lens unit; a rigid flexible substrate equipped with a solid-state imaging element and bonded with a flexible print circuit (FPC) drawer unit; and a frame that connects the lens unit with the rigid flexible substrate and includes an opening, in which the frame and the rigid flexible substrate are adhered to each other by adhesive applied on an abutment surface excluding a portion of a range including a bonding section with the FPC drawer unit, and reinforcement resin configured to reinforce a bonding section between the rigid flexible substrate and the FPC drawer unit or reinforce a bonding section between the rigid flexible substrate and the frame is applied so as to cover the portion of the range on which the adhesive has not been applied.

It is possible to form a vent hole in a space between the frame and the rigid flexible substrate by the range on which the adhesive has not been applied.

The reinforcement resin can be applied so as to close the vent hole.

The vent hole can have a range shorter than a length of a side of the frame that is rectangular.

The vent hole can be formed at a plurality of positions.

The adhesive can be one of UV thermosetting resin cured by emission of ultra violet (UV) together with heat, and thermosetting resin cured solely by heat.

The reinforcement resin can be one of UV curing resin cured by emission of ultra violet (UV), UV thermosetting resin cured by UV together with heat, and thermosetting resin cured solely by heat.

The reinforcement resin can be light-shielding resin.

The reinforcement resin can have an elasticity range of 100 MPa to 10000 MPa at 25° C.

The adhesive can be applied on any of a surface of the frame and a surface of the rigid flexible substrate surface, among abutment surfaces between the frame and the rigid flexible substrate.

The rigid flexible substrate can include a substrate equipped with a solid-state imaging element and can include a flexible board including a drawer unit.

A mold can be included between the rigid flexible substrate and the frame.

The frame can be integrated with the lens unit.

A method for manufacturing a camera module according to one aspect of the present technology, the camera module including: a lens unit; a rigid flexible substrate equipped with a solid-state imaging element and bonded with a flexible print circuit (FPC) drawer unit; and a frame that connects the lens unit with the rigid flexible substrate and includes an opening, in which the frame and the rigid flexible substrate are adhered to each other by adhesive applied on an abutment surface excluding a portion of a range including a bonding section with the FPC drawer unit, and thereafter, reinforcement resin configured to reinforce a bonding section between the rigid flexible substrate and the FPC drawer unit or a bonding section between the rigid flexible substrate and the frame is applied so as to cover the portion of the range on which the adhesive has not been applied.

An imaging apparatus according to one aspect of the present technology includes: a lens unit; a rigid flexible substrate equipped with a solid-state imaging element and bonded with a flexible print circuit (FPC) drawer unit; and a frame that connects the lens unit with the rigid flexible substrate and includes an opening, in which the frame and the rigid flexible substrate are adhered to each other by adhesive applied on an abutment surface excluding a portion of a range including a bonding section with the FPC drawer unit, and reinforcement resin configured to reinforce a bonding section between the rigid flexible substrate and the FPC drawer unit or a bonding section between the rigid flexible substrate and the frame is applied so as to cover the portion of the range on which the adhesive has not been applied.

An electronic instrument according to one aspect of the present technology includes:

a lens unit; a rigid flexible substrate equipped with a solid-state imaging element and bonded with a flexible print circuit (FPC) drawer unit; and a frame that connects the lens unit with the rigid flexible substrate and includes an opening, in which the frame and the rigid flexible substrate are adhered to each other by adhesive applied on an abutment surface excluding a portion of a range including a bonding section with the FPC drawer unit, and reinforcement resin configured to reinforce a bonding section between the rigid flexible substrate and the FPC drawer unit or a bonding section between the rigid flexible substrate and the frame is applied so as to cover the portion of the range to which the adhesive has not been applied.

One aspect of the present technology includes: a lens unit; a rigid flexible substrate equipped with a solid-state imaging element and bonded with a flexible print circuit (FPC) drawer unit; and a frame that connects the lens unit with the rigid flexible substrate and includes an opening, in which the frame and the rigid flexible substrate are adhered to each other by application of adhesive onto an abutment surface between the frame and the rigid flexible substrate excluding a portion of a range including a bonding section with the FPC drawer unit, and reinforcement resin configured to reinforce a bonding section between the rigid flexible substrate and the FPC drawer unit or a bonding section between the rigid flexible substrate and the frame is applied so as to cover the portion of the range on which the adhesive has not been applied.

Effects of the Invention

According to one aspect of the present technology, it is possible to reduce the number of steps in the camera module manufacturing process and to suppress generation of a black spot due to dust.

MODE FOR CARRYING OUT THE INVENTION

<Structure of Known Camera Module>

Figure 1:
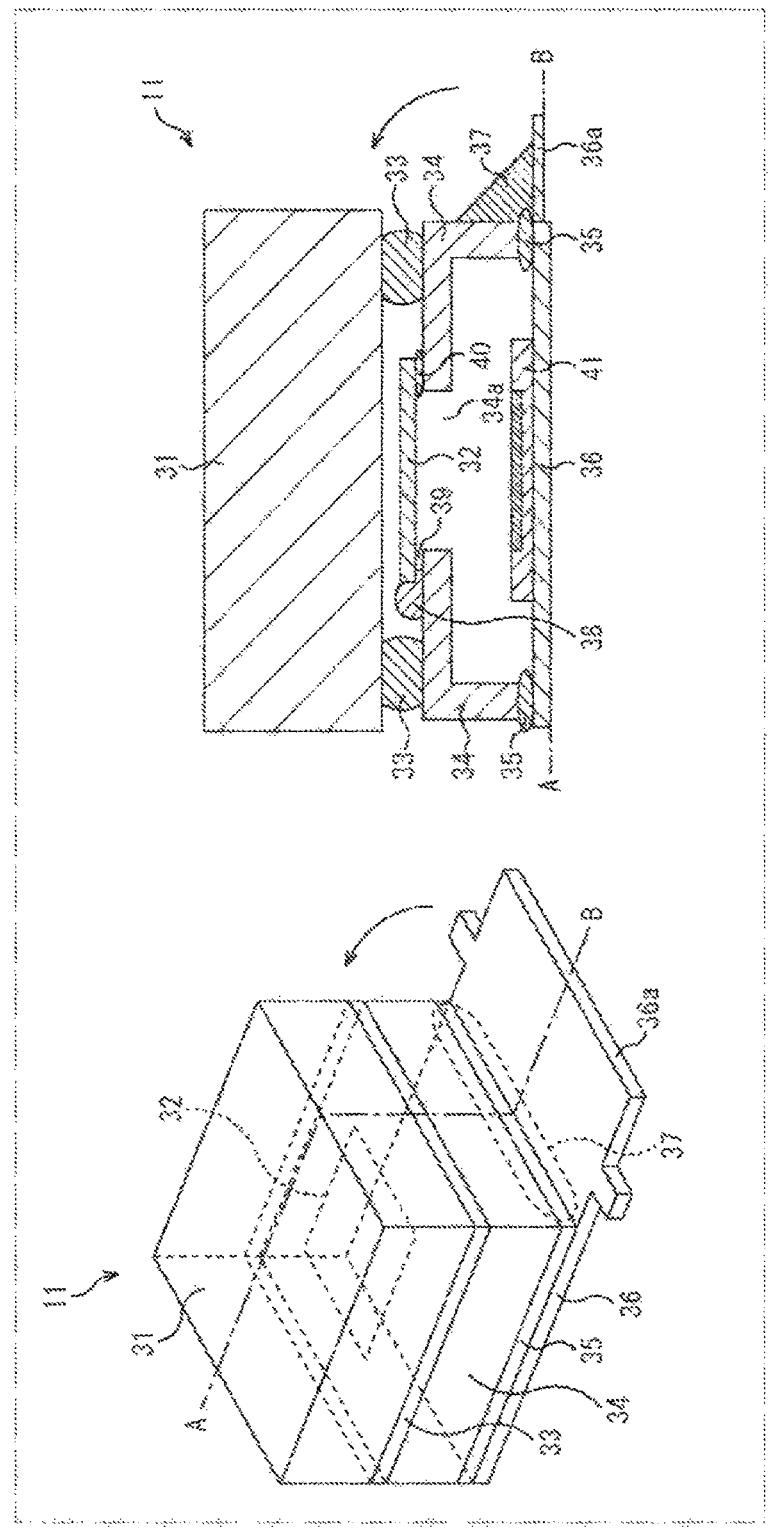
FIG. 1 is a diagram illustrating an exemplary configuration of a known camera module.

FIG. 1 includes a perspective view and a cross-sectional side view of a known camera module. More specifically, a left portion of FIG. 1 is a perspective view of the camera module and a right portion of FIG. 1 is a cross-sectional side view of the camera module. Note that the cross-sectional side view in the right portion of FIG. 1 is an A-B cross-section taken along A-B in the perspective view in the left portion of FIG. 1.

A camera module 11 in FIG. 1 includes, in the order from the upper portion of the diagram as an incident direction of incident light from an subject, a lens unit 31, an infrared ray cut filter (IRCF) 32, a frame 34, a rigid flexible substrate 36 including a solid-state imaging element 41.

The lens unit 31 and the solid-state imaging element 41 are coaxially disposed. On the frame 34, an opening 34a is provided at a position corresponding to the solid-state imaging element 41, and the IRCF 32 is provided so as to close the opening 34a.

With this configuration, light that transmitted through the lens unit 31 is then transmitted through the IRCF 32, and becomes incident on the solid-state imaging element 41.

More specifically, the camera module 11 in FIG. 1 is configured such that the frame 34 including the IRCF 32 is placed on the rigid flexible substrate 36 provided with an image sensor 41. The frame 34 is adhered to the rigid flexible substrate 36 by application of thermosetting frame resin 35 on an adhesion surface therebetween.

On the frame 34, the rectangular opening 34a is arranged at a position corresponding to the image sensor 41, and a vent hole 39 is formed by adhesion of the IRCF 32 by application of adhesive 40 so as to enclose the opening 34a excluding one rectangular side of the opening 34a.

With this configuration, when the frame 34 and the rigid flexible substrate 36 are adhered to each other by the frame resin 35 cured by heat, the air expanded by the heat is discharged from the vent hole 39.

Furthermore, after adhesion of the frame 34 with the rigid flexible substrate 36 by the frame resin 35, post sealing resin 38 is applied so as to close the vent hole 39.

The vent hole 39 is closed by the post sealing resin 38, thereby preventing the dust from entering through the vent hole 39, making it possible to suppress generation of a black spot attributed to stain deposition on the solid-state imaging element 41.

Still thereafter, lens unit fastening resin 33 is applied on an end portion of the upper surface of the frame 34, and then, the lens unit 31 is placed and adhered onto the frame 34.

Thereafter, reinforcement resin 37 is applied on a root portion of a flexible print circuit (FPC) drawer unit 36a extending at a lower right portion in the diagram, along the bonding surface of the frame 34 with the rigid flexible substrate 36.

By applying the reinforcement resin 37 in this manner, it is possible to achieve folding of the FPC drawer unit 36a in a direction of an arrow or opposite direction of the arrow in the diagram, without damaging the module.

The known camera module 11 is manufactured with the above-described processes.

These processes, however, needs another separate process to apply the post sealing resin 38 to close the vent hole 39.

First Embodiment

Figure 2:
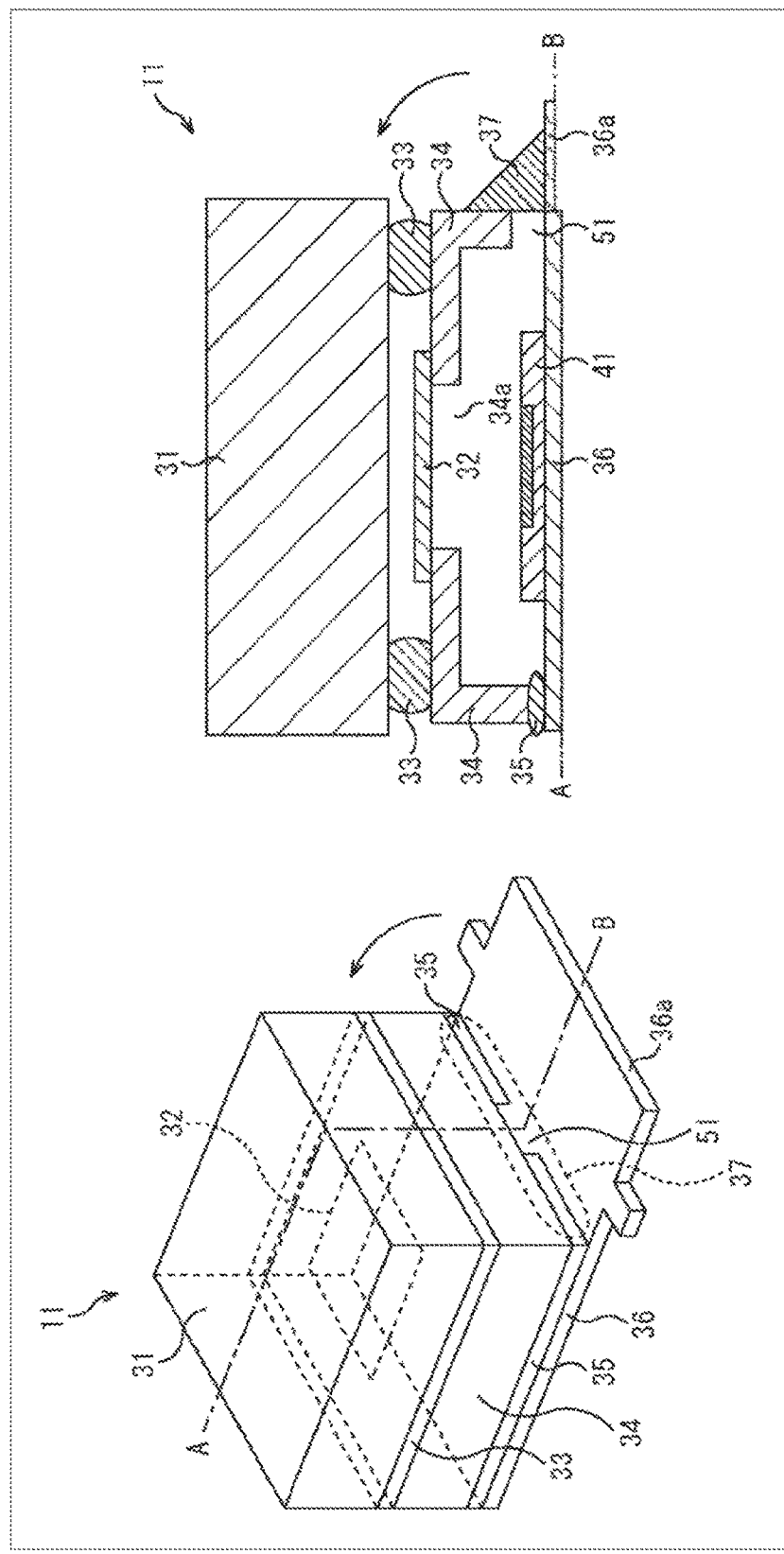
FIG. 2 is a diagram illustrating an exemplary configuration of a camera module according to a first embodiment of the present technology.

FIG. 2 includes a perspective view of the camera module according to a first embodiment of the present technology and a cross-sectional side view taken along the A-B cross-section in the perspective view. Note that components of the camera module in FIG. 2, having same function as the function of the camera module in FIG. 1, will be given same terms and signs, and description thereof will be omitted as appropriate.

That is, differences of the camera module 11 in FIG. 2 from the camera module 11 in FIG. 1 are in that the frame resin 35 as adhesive is not applied at a portion that comes in contact with the FPC drawer unit 36a, that is one side of four sides of the frame 34 that is rectangular in top view, and that the opening of the frame 34 is bonded with the IRCF 32 in a state where four sides are completely abutted, without no gap such as the vent hole 39.

With this configuration, a slit-like vent hole 51 is formed between the frame 34 and the rigid flexible substrate 36 at a portion of the side that comes in contact with the FPC drawer unit 36a, as one side of four sides of the frame 34 when the frame 34 and the rigid flexible substrate 36 are abutted with each other.

As a result, even when the frame resin 35 on mutually abutting portion is heated to be cured to bond the frame 34 with the rigid flexible substrate 36, it would be possible to discharge the expanded gas from the slit-like vent hole 51 formed at a portion of the abutting portion between the frame 34 and the rigid flexible substrate 36.

Moreover, by applying the reinforcement resin 37 so as to close the vent hole 51 after bonding the frame 34 with the rigid flexible substrate 36 by curing the frame resin 35, it would be possible to omit a dedicated process of solely applying the post sealing resin 38 to close the vent hole 51.

<Camera Module Manufacturing Process in FIG. 2>

Figure 3:
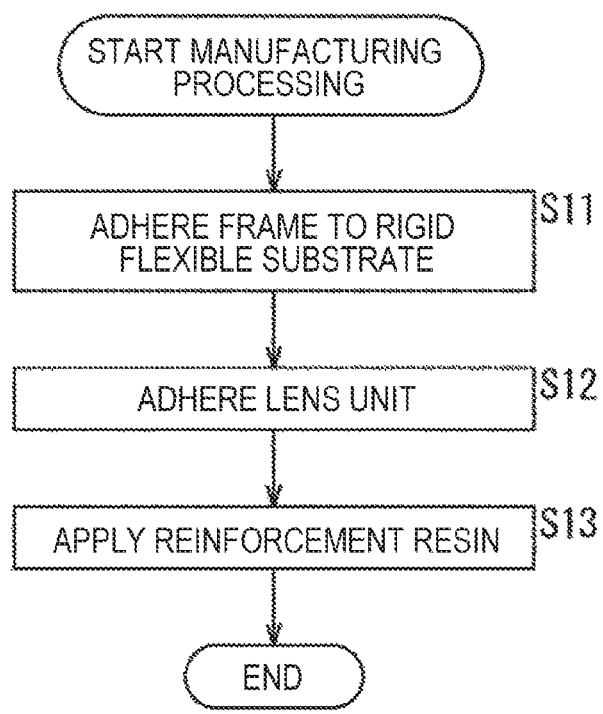
FIG. 3 is a flowchart illustrating manufacturing processing of the camera module in FIG. 2.

Next, a manufacturing process of the camera module in FIG. 2 will be described with reference to the flowchart in FIG. 3.

Figure 4:
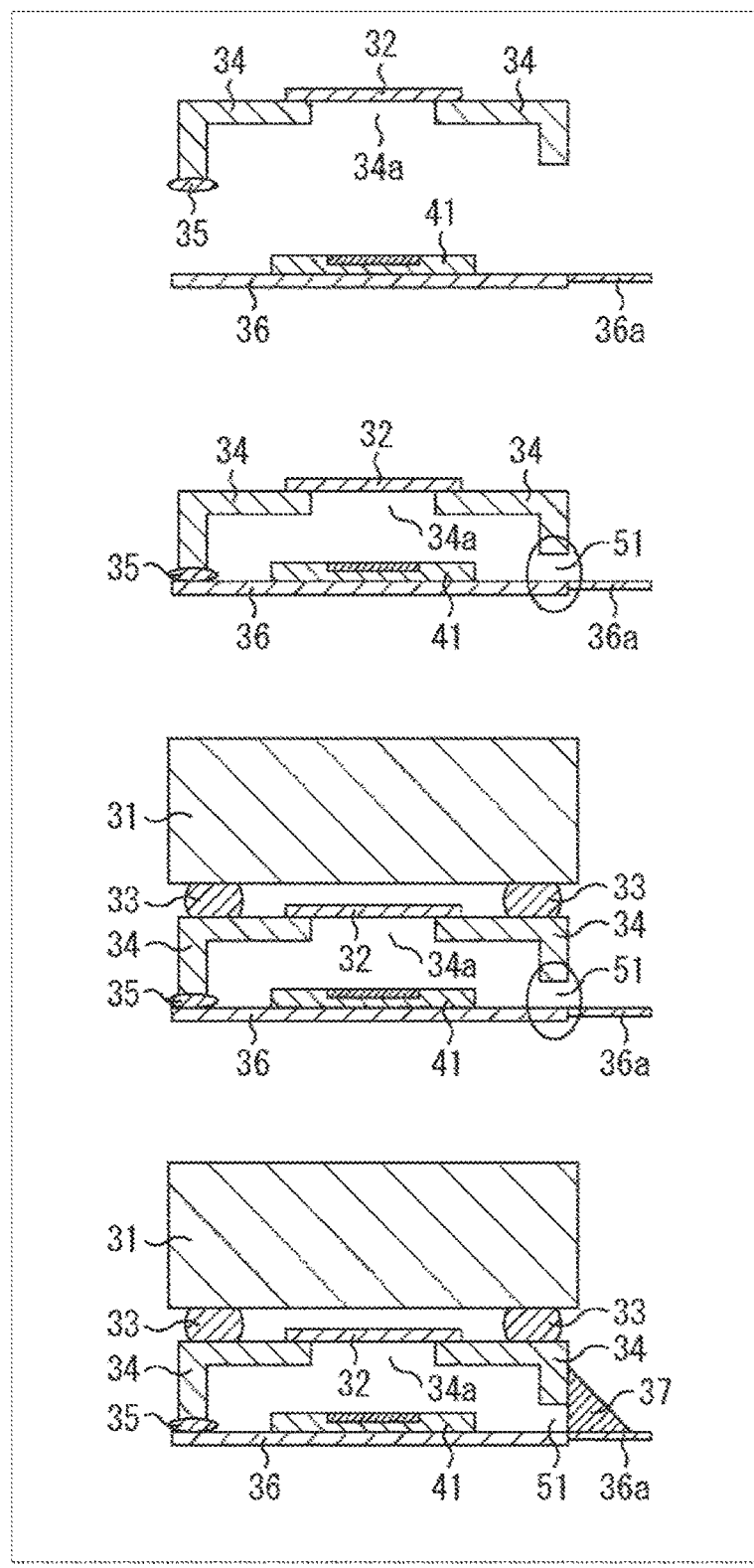
FIG. 4 is a diagram illustrating manufacturing processing of the camera module in FIG. 2.

In step S11, as illustrated in first and second drawings from the top in FIG. 4, the IRCF 32 is connected onto the frame 34 so as to completely close the opening 34a, and the frame 34 is placed and adhered onto the rigid flexible substrate 36 by applying the frame resin 35 on an abutting site, that is, a range excluding a portion of the side that comes in contact with the FPC drawer unit 36a.

Figure 5:
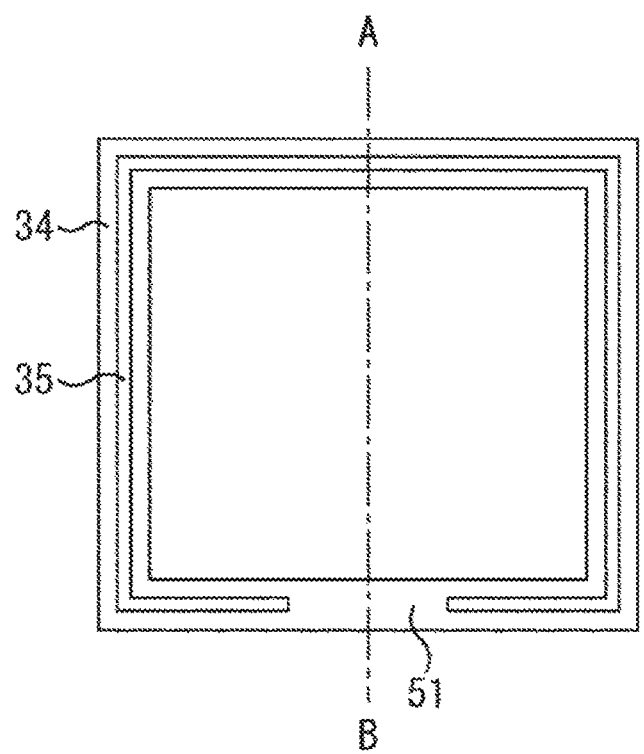
FIG. 5 is a diagram illustrating a positional relationship between a frame and frame resin applied on the frame.

More specifically, as illustrated in FIG. 5, viewed from the lower direction of the frame 34 in FIG. 4, the frame resin 35 is applied on an end portion, that is, a range excluding a portion of the side that comes in contact with the FPC drawer unit 36a, and the frame 34 is adhered to the rigid flexible substrate 36 as illustrated in the second drawing from the top in FIG. 4. Note that, as illustrated in FIG. 5, the frame resin 35 may be applied at a portion near the center in a range shorter than the length of one side for the abutting site of the rectangular frame 34 with the rigid flexible substrate 36, that is the side that comes in contact with the FPC drawer unit 36a, and may be applied on all the range for other sides or applied on a corresponding position on the rigid flexible substrate 36.

The frame resin 35 applied in this manner enables gas to be discharged from the vent hole 51 with a slit-like shape even when the gas of the space between the frame 34 and the rigid flexible substrate 36 is expanded by heating the frame resin 35 at curing. The frame resin 35 may be formed of thermosetting resin or may be formed of UV+ thermosetting resin that is cured by heating after emission of ultraviolet (UV).

In step S12, as illustrated in a third drawing from the top in FIG. 4, the lens unit 31 and the frame 34 are adhered to each other by the lens unit fastening resin 33.

In step S13, as illustrated in the drawing at the bottom in FIG. 4, the reinforcement resin 37 is applied on a site that comes in contact with the FPC drawer unit 36a, on which the vent hole 51 is formed, and cured by heating, thereby completing the manufacture.

Moreover, the reinforcement resin 37 may be formed of thermosetting resin, UV resin that is cured by emission of ultraviolet (UV), or UV+ thermosetting resin that is cured by heating after emission of ultraviolet (UV). Moreover, by using light-shielding resin having black color, or the like, having an elasticity range of 100 MPa to 10000 MPa at 25° C., as the reinforcement resin 37, it is possible to suppress flare due to light incident through the vent hole 51.

The reinforcement resin 37 is originally intended to reinforce a bonding section between the rigid flexible substrate 36 and FPC drawer unit 36a, and a bonding section between the rigid flexible substrate 36 and the frame 34. Accordingly, with the presence of the site naturally reinforced by application of the reinforcement resin 37, it is possible to avoid the breakage of the FPC unit or destruction of adhesion with other component even when the FPC drawer unit 36a is folded in the arrow direction or the opposite direction thereof in FIG. 2. Moreover, the reinforcement resin 37 is originally intended to be applied on the site on which the vent hole 51 is arranged. Accordingly, the process of applying the reinforcement resin 37 is included in the manufacturing process of the known camera module 11. Therefore, the process of closing the vent hole 51 can be included in the reinforcement resin 37 application process, making it possible to omit a process dedicated solely for closing the vent hole 51, and to reduce the number of steps in the entire manufacturing process.

First Modification Example

The above describes an exemplary configuration in which the frame resin 35 is not applied on the adhesion site between the rigid flexible substrate 36 and the frame 34, that is, a range shorter than a side on the side on which the reinforcement resin 37 is not applied, and the reinforcement resin 37 is applied thereafter. Alternatively, it is possible to have other configurations as long as the frame resin 35 is ultimately not applied at a portion of the site on which the reinforcement resin 37 is applied.

Figure 6:
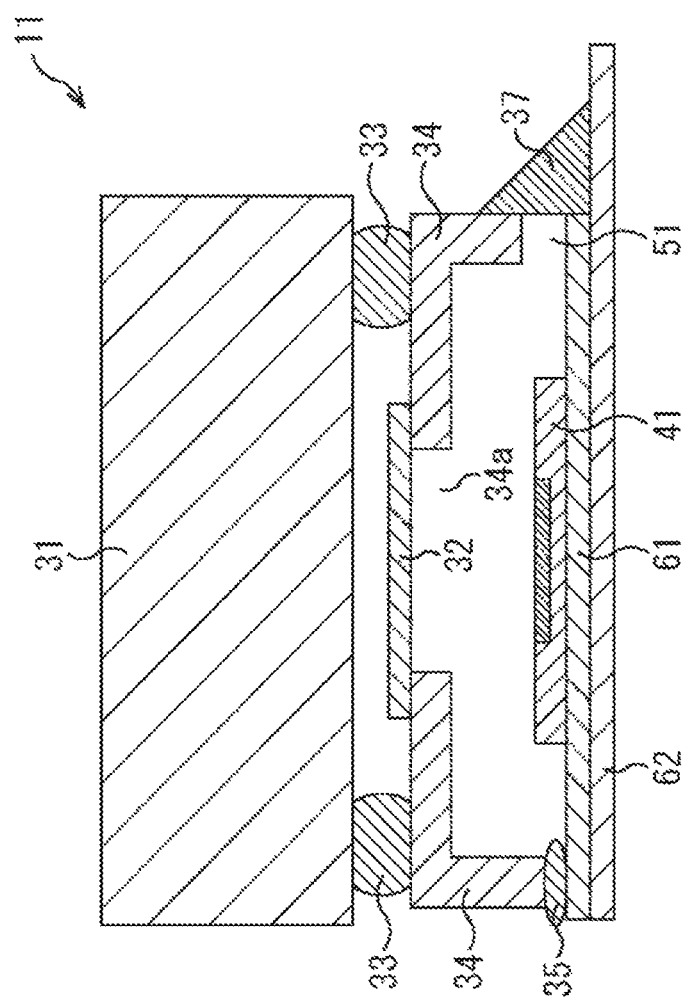
FIG. 6 is a diagram illustrating a first modification example of the camera module according to the present technology.

For example, as illustrated in FIG. 6, in a case where a solid-state imaging element is provided on a substrate 61 and a flexible board 62 is provided beneath the substrate 61, it would be also allowable to configure such that the frame 34 and the substrate 61 are adhered to each other so as not to apply the frame resin 35 on a site from which the flexible board 62 is drawn, that is, a portion of the site on which the reinforcement resin 37 is applied, among the adhesion site between the frame 34 the substrate 61. That is, the configuration illustrated in FIG. 6 can be considered to include the rigid flexible substrate 36 being substantially constituted using the substrate 61 and the flexible board 62. With this configuration, the vent hole 51 is formed as illustrated in FIG. 6. Accordingly, at the time of heating the frame resin 35 for curing when the frame 34 and the substrate 61 are adhered to each other, expanded gas is discharged from the vent hole 51, and together with this, the reinforcement resin 37 is applied after adhesion, thereby closing the vent hole 51. This makes it possible to close the vent hole 51 while omitting a process solely dedicated for closing the vent hole 51. As a result, it is possible to prevent a deposition material from entering the solid-state imaging element 41 and to suppress generation of black spots.

Second Modification Example

The above describes an exemplary case where the frame resin 35 is used for connecting the frame 34 with the rigid flexible substrate 36. Alternatively, it is also allowable to use a mold between the frame 34 and the rigid flexible substrate 36. In this case, as illustrated in FIG. 7, among portions of a mold 71, a site is provided that does not come in contact with the frame at a portion that is at a position corresponding to the FPC drawer unit 36a, that is, a portion corresponding to a site on which the reinforcement resin 37 is not applied in later processing, or such that the vent hole 51 is formed by not applying the frame resin 35.

Figure 7:
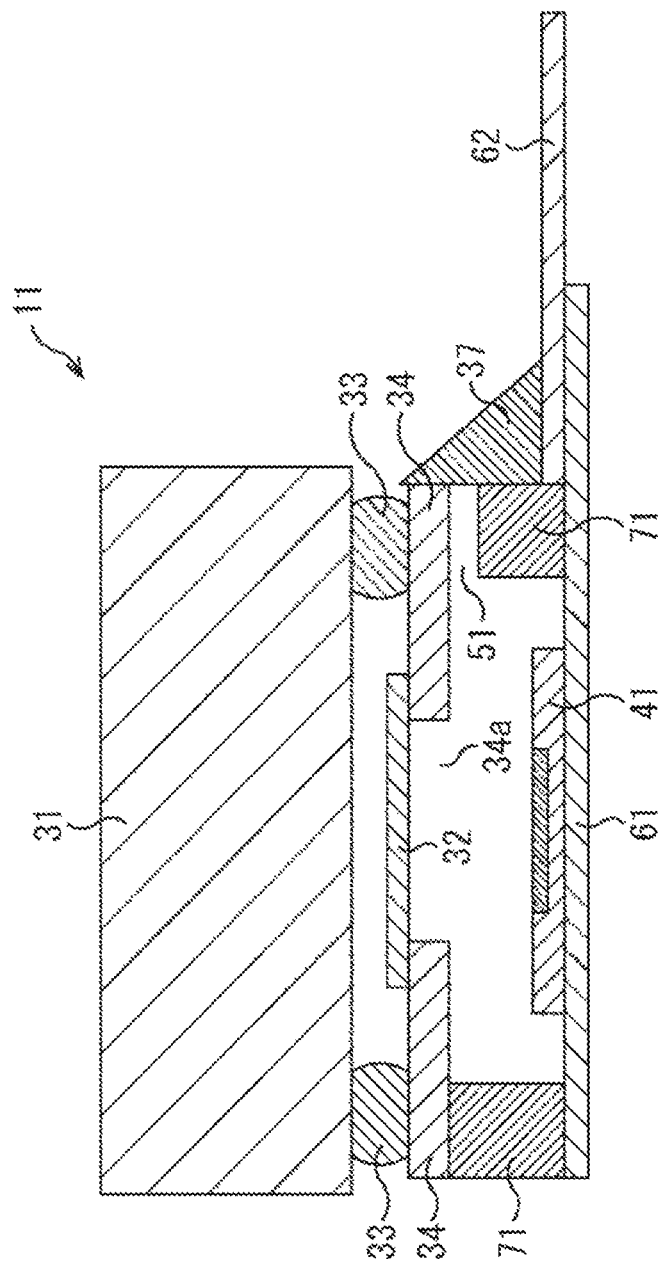
FIG. 7 is a diagram illustrating a second modification example of the camera module according to the present technology.

As a result, the configuration illustrated in FIG. 7 enables achieving similar effects as in a case of the camera module 11 illustrated in FIGS. 2 and 6.

Third Modification Example

The above describes an exemplary case where the vent hole 51 is provided at one location. Alternatively, it is possible to provide the vent hole 51 at a plurality of locations as long as the location is a portion of the surface on which the frame 34 and the rigid flexible substrate 36 are adhered to each other, that is, the range on which the reinforcement resin 37 is applied in a later process.

Figure 8:
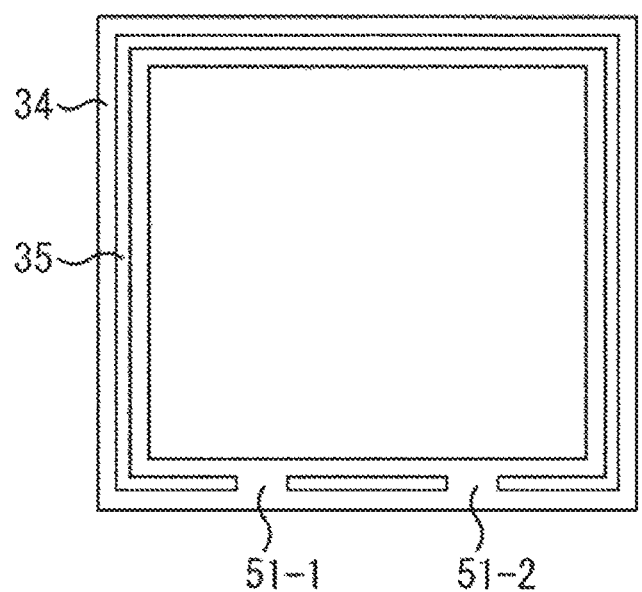
FIG. 8 is a diagram illustrating a third modification example of the camera module according to the present technology.

That is, for example, it is also allowable to provide vent holes 51-1 and 51-2, as illustrated in FIG. 8, by providing two sites on which the frame resin 35 is not applied when the frame 34 and the rigid flexible substrate 36 are adhered to each other. Alternatively, it is allowable to provide more than two vent holes 51.

As a result, the configuration illustrated in FIG. 8 enables achieving similar effects as in the case of the camera module 11 illustrated in FIGS. 2, 6, and 7.

Second Embodiment

The above describes an exemplary case where the vent hole 51 is formed at an adhesion site between the frame 34 and the rigid flexible substrate 36 by providing a region on which the frame resin 35 is not applied, at a portion of a surface on which the frame 34 and the rigid flexible substrate 36 are adhered to each other, that is, a portion of a region on which the reinforcement resin 37 is applied in later processing.

Alternatively, however, it is also allowable to configure such that the vent hole 51 needed for curing the frame resin 35 is provided at any of sites and the vent hole 51 is closed by an adhesive tape after completion of adhesion of the frame 34 with the rigid flexible substrate 36.

Figure 9:
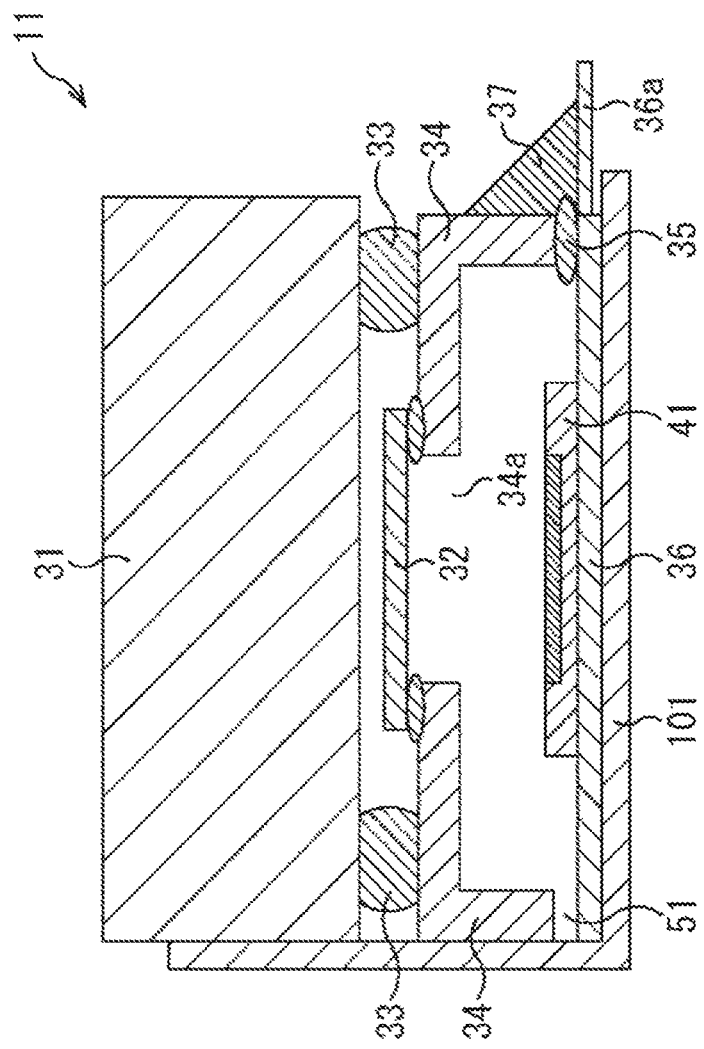
FIG. 9 is a diagram illustrating an exemplary configuration of a camera module according to a second embodiment of the present technology.

FIG. 9 illustrates an exemplary configuration of the camera module 11, in which the vent hole 51 needed for curing the frame resin 35 is provided at any of sites and the vent hole 51 is closed by an adhesive tape after completion of adhesion of the frame 34 with the rigid flexible substrate 36. Note that components in FIG. 9, having same function as the function of the camera module in FIG. 2, will be given same terms and signs, and description thereof will be omitted as appropriate.

That is, the differences of the camera module 11 in FIG. 9 from the camera module 11 in FIG. 2 are that the vent hole 51 is formed by providing a site on which the frame resin 35 is not applied, at a portion of the side opposite to the side on which the reinforcement resin 37 is applied, among the end portions of the frame 34, and that the site is further coated by an adhesive tape 101.

With this configuration, even when the frame resin 35 on mutual abutment portion is heated to be cured to bond the frame 34 with the rigid flexible substrate 36, it would be possible to discharge the expanded gas from the slit-like vent hole 51 formed at a portion of the abutting portion between the frame 34 and the rigid flexible substrate 36.

Moreover, the frame 34 and the rigid flexible substrate 36 are bonded with each other by curing of the frame resin 35, and thereafter, the adhesive tape 101 is attached so as to close the vent hole 51. With this configuration, even when a gap is generated that might break the air-tightness among the adhesive tape 101, the frame 34, and the rigid flexible substrate 36, it would be possible to prevent dust from entering the space between the frame 34 and the rigid flexible substrate 36 by attracting and catching the dust using adhesiveness of the adhesive tape 101, and to suppress generation of a black spot.

Note that, in the description of the example in FIG. 9, the vent hole 51 formed by not applying the frame resin 35 is provided at a portion of the side opposite to the side on which the reinforcement resin 37 is applied. Alternatively, however, it is also allowable to form the vent hole 51 formed by a portion of the side on which the reinforcement resin 37, or the like, is not applied in later processing, on other sites as long as it is a site on which the adhesive tape 101 is attached.

<Camera Module Manufacturing Process in FIG. 9>

Figure 10:
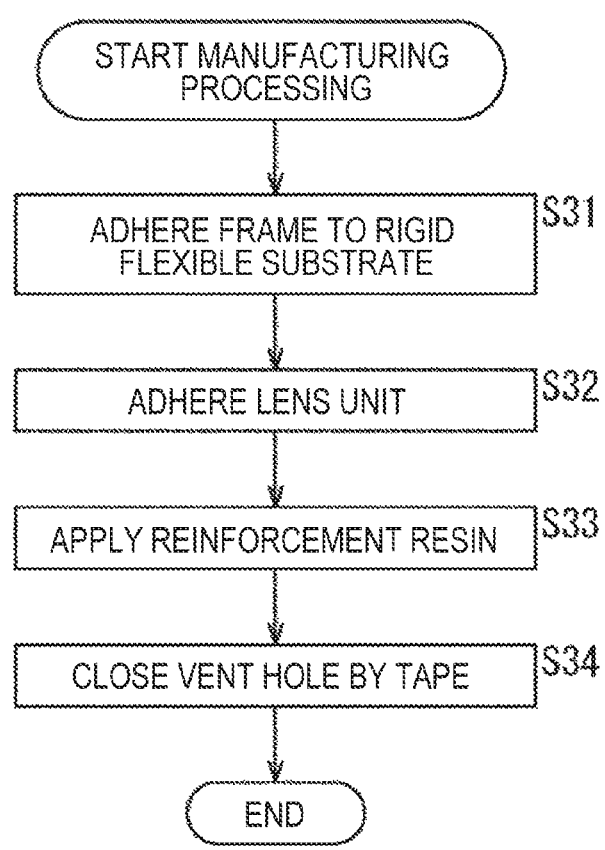
FIG. 10 is a flowchart illustrating manufacturing processing of the camera module in FIG. 9.

Next, a manufacturing process of the camera module in FIG. 9 will be described with reference to the flowchart in FIG. 10.

Figure 11:
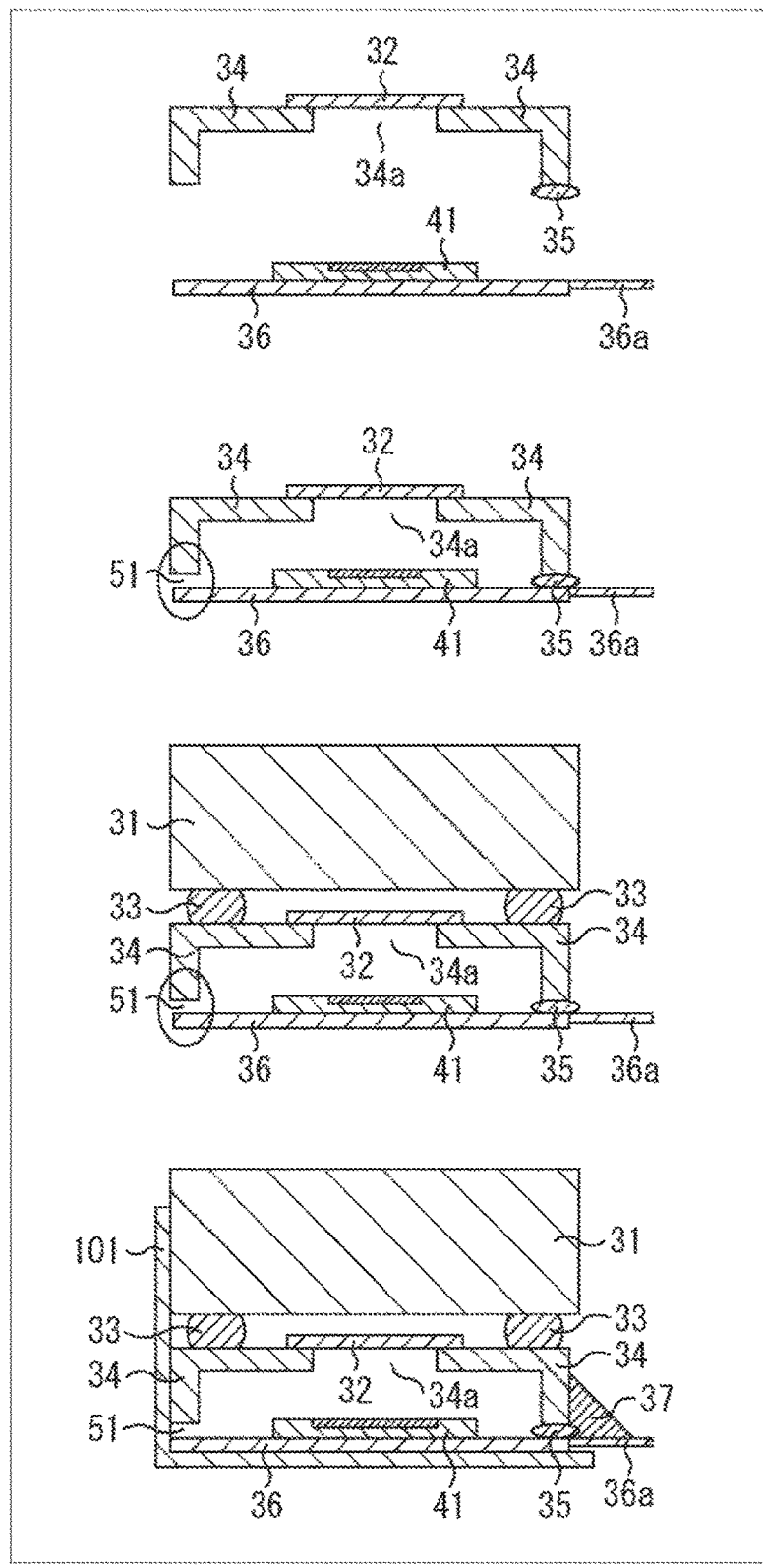
FIG. 11 is a diagram illustrating manufacturing processing of the camera module in FIG. 9.

In step S31, as illustrated in first and second drawings from the top in FIG. 11, the IRCF 32 is connected onto the frame 34 so as to completely close the opening 34a, and the frame 34 is placed on the rigid flexible substrate 36 and adhered to the rigid flexible substrate 36 by applying the frame resin 35 on an abutting site, that is, a range excluding a portion of the side opposite to the side that comes in contact with the FPC drawer unit 36a.

The frame resin 35 applied in this manner enables discharge of gas from the slit-like vent hole 51 even when the gas of the space between the frame 34 and the rigid flexible substrate 36 is expanded by heating the frame resin 35 at curing. The frame resin 35 may be formed of thermosetting resin or may be formed of UV+ thermosetting resin that is cured by heating after emission of ultraviolet (UV). Note that, as illustrated in FIG. 5, the frame resin 35 may be applied at a portion near the center in a range shorter than the length of one side for the abutting site of the rectangular frame 34 with the rigid flexible substrate 36, that is the side that comes in contact with the FPC drawer unit 36a, and may be applied on all the range for other sides or applied on a corresponding position on the rigid flexible substrate 36.

In step S32, as illustrated in a third drawing from the top in FIG. 11, the lens unit 31 and the frame 34 are adhered to each other by the lens unit fastening resin 33.

In step S33, as illustrated in the third drawing from the top in FIG. 11, the reinforcement resin 37 is applied on a site that comes in contact with the FPC drawer unit 36a.

Moreover, the reinforcement resin 37 may be formed not only of UV curing resin and thermosetting resin, but also of UV+ thermosetting resin that is cured by heating after emission of ultraviolet (UV). Moreover, by using light-shielding resin having black color, or the like, having an elasticity range of 100 MPa to 10000 MPa, as the reinforcement resin 37, it is possible to suppress flare due to light incident through the vent hole 51.

In step S34, as illustrated in the drawing at the bottom in FIG. 11, the adhesive tape 101 is attached so as to close the vent hole 51, thereby completing the manufacture.

The adhesive tape 101 is supposed to be attached at a position illustrated in the drawing at the bottom in FIG. 11, and therefore, the process of attaching the adhesive tape 101 is an originally existing process. Therefore, the vent hole 51 is closed by the adhesive tape 101 that is supposed to be attached there, making is possible to omit a process of closing the vent hole 51, leading to achievement of reduction of the number of steps in the entire manufacturing process.

Moreover, since the adhesive tape 101 is attached so as to close the vent hole 51, it is possible to prevent dust, or the like, that directly passes through the vent hole 51 from entering inside. Moreover, while there is a possibility of generation of a minute gap on an adhesion surface between the frame 34 and the rigid flexible substrate 36 when the adhesive tape 101 is attached, since it is possible to catch the dust by adhesiveness of the adhesive tape 101, it is possible to prevent the dust from entering the space between the frame 34 and the rigid flexible substrate 36, and to suppress generation of a black spot.

Note that, the vent hole 51 may be arranged at a single position or at a plurality of positions similarly to the above-described example in FIG. 8. In this case, the position may be any position as long as it is a site to which the adhesive tape 101 can be attached in a later stage.

Fourth Modification Example

The above describes an exemplary configuration in which the reinforcement resin 37 is not applied on an adhesion site between the rigid flexible substrate 36 and the frame 34, that is, a portion of the site on which the frame resin 35 is not applied, and the adhesive tape 101 is attached afterward. Alternatively, it is also allowable to use another configuration as long as the adhesive tape 101 is attached, in a later process, to a site where the frame resin 35 is not applied ultimately.

Figure 12:
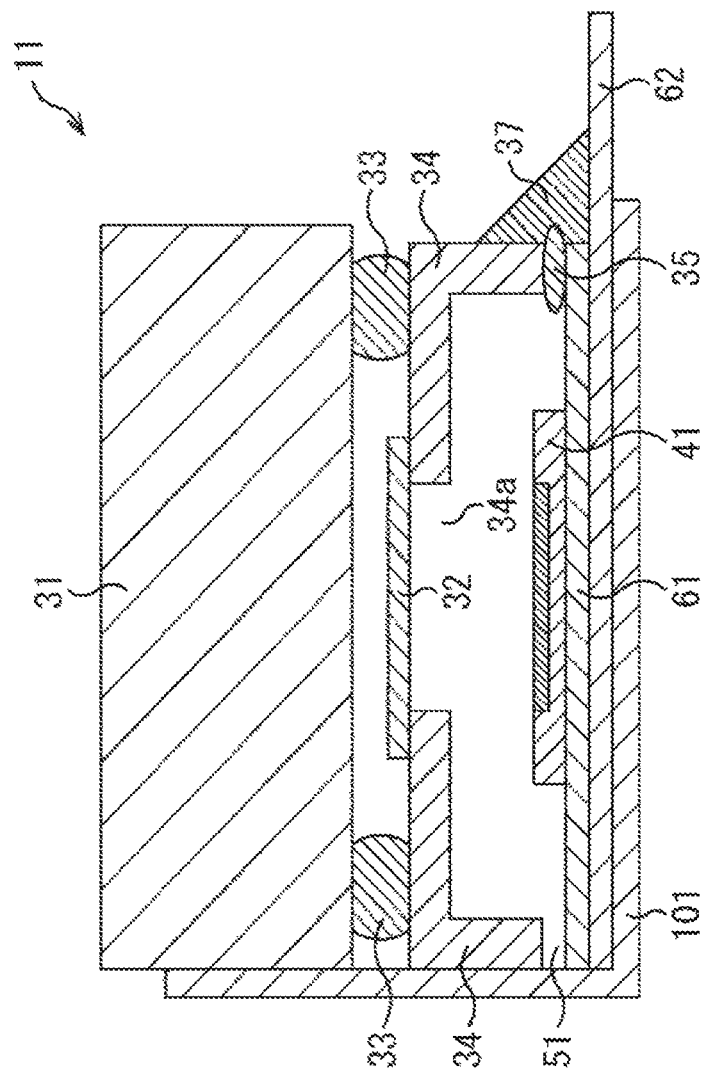
FIG. 12 is a diagram illustrating a fourth modification example of the camera module according to the present technology.

For example, as illustrated in FIG. 12, in a case where the solid-state imaging element 41 is provided on a substrate 61 and a flexible board 62 is provided beneath the substrate 61, it would be also allowable to configure such that the frame 34 and the substrate 61 are adhered to each other so as not to apply the frame resin 35 at a portion of the site on which the reinforcement resin 37 is not applied, among the adhesion site between the frame 34 the substrate 61. That is, the configuration illustrated in FIG. 12 can be considered to include the rigid flexible substrate 36 being substantially constituted using the substrate 61 and the flexible board 62. With this configuration, the vent hole 51 is formed as illustrated in FIG. 12. Accordingly, at the time of heating the frame resin 35 for curing when the frame 34 and the substrate 61 are adhered to each other, expanded gas is discharged from the vent hole 51, and together with this, the adhesive tape 101 is attached after adhesion, thereby closing the vent hole 51. This makes it possible to prevent dust from entering from the vent hole 51. As a result, it is possible to prevent a deposition material from entering the solid-state imaging element 41 and to suppress generation of a black spot.

Fifth Modification Example

The above describes an exemplary case where the frame resin 35 is used for connecting the frame 34 with the rigid flexible substrate 36. Alternatively, it is also allowable to use the mold 71 instead of the frame resin 35. In this case, as illustrated in FIG. 13, the vent hole 51 is formed by providing a site, among the mold 71, in which a portion of the site on which the reinforcement resin 37 is not applied does not come in contact with the frame 34.

Figure 13:
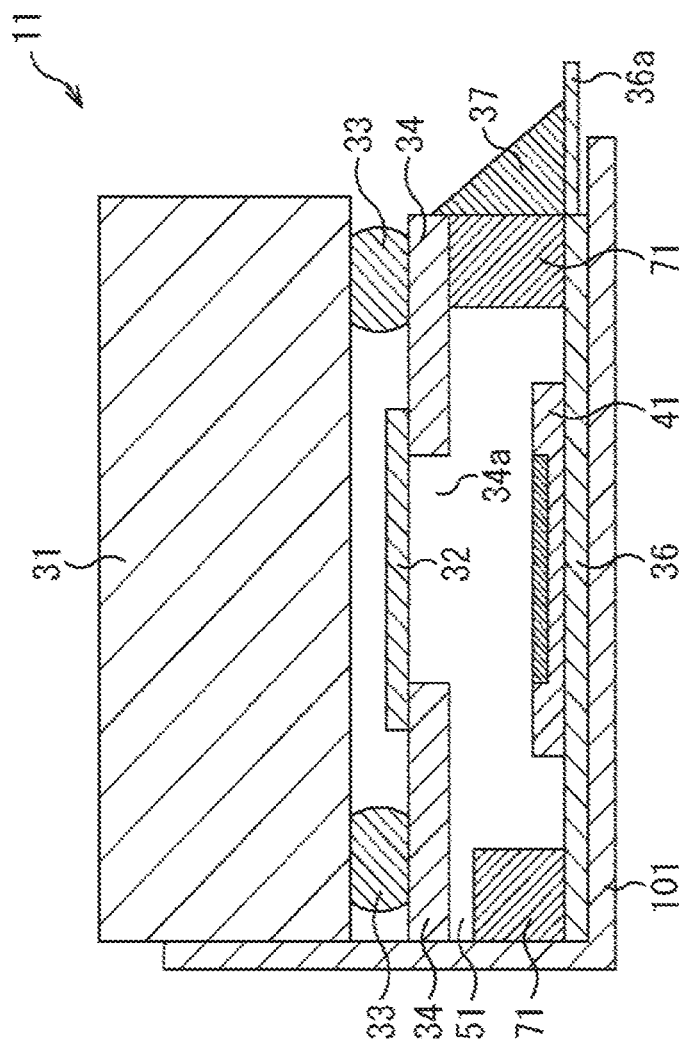
FIG. 13 is a diagram illustrating a fifth modification example of the camera module according to the present technology.

As a result, the configuration illustrated in FIG. 13 enables achieving similar effects as in a case of the camera module illustrated in FIGS. 9 and 12.

Sixth Modification Example

While the above describes an exemplary case where the vent hole 51 is formed by not applying the frame resin 35 at a portion of the abutting site between the frame 34 and the rigid flexible substrate 36, it is allowable to form the vent hole 51 to any site as long as it is the site to which the adhesive tape 101 is attached in later processing.

Figure 14:
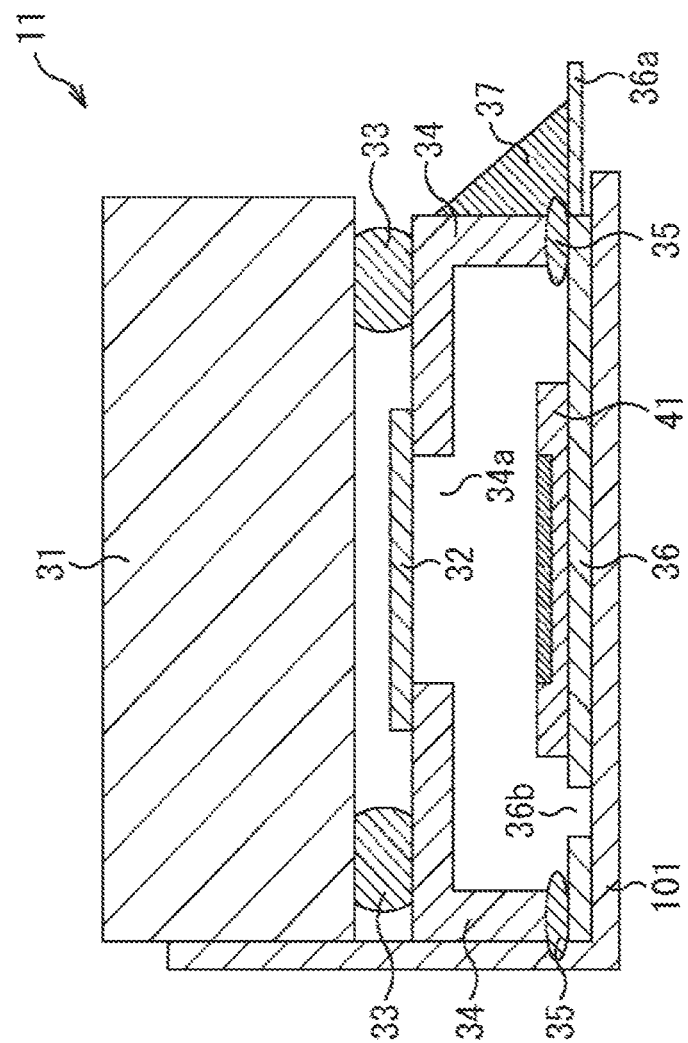
FIG. 14 is a diagram illustrating a sixth modification example of the camera module according to the present technology.

For example, as illustrated in FIG. 14, by forming a hole portion 36b that penetrates through the rigid flexible substrate 36 at a portion of the rigid flexible substrate 36 and using this hole portion 36b as a vent hole instead of the vent hole 51, it is possible to discharge the expanded gas when the frame resin 35 is cured. Furthermore, after the frame resin 35 is cured, the adhesive tape 101 is attached so as to close the vent hole formed by a hole portion 31b. This makes it possible to prevent dust from entering the space between the frame 34 and the rigid flexible substrate 36, and thus to suppress generation of a black spot on the solid-state imaging element 41. Note that, also in this case, the hole portion 36b may be provided at a plurality of positions as long as the position enables attaching of the adhesive tape 101 in later processing. Alternatively, it is allowable to provide a through hole instead of the hole portion 36b.

Third Embodiment

The above describes an exemplary configuration in which the lens unit 31 is fixed to the rigid flexible substrate 36 by adhering the frame 34 with the rigid flexible substrate 36 using the frame resin 35, and by further adhering the frame 34 with the lens unit 31 using the lens unit fastening resin 33.

Alternatively, however, it is also allowable to directly adhere the lens unit 31 with the rigid flexible substrate 36 using the lens unit 31 that integrates the frame 34 and the lens unit 31.

Figure 15:
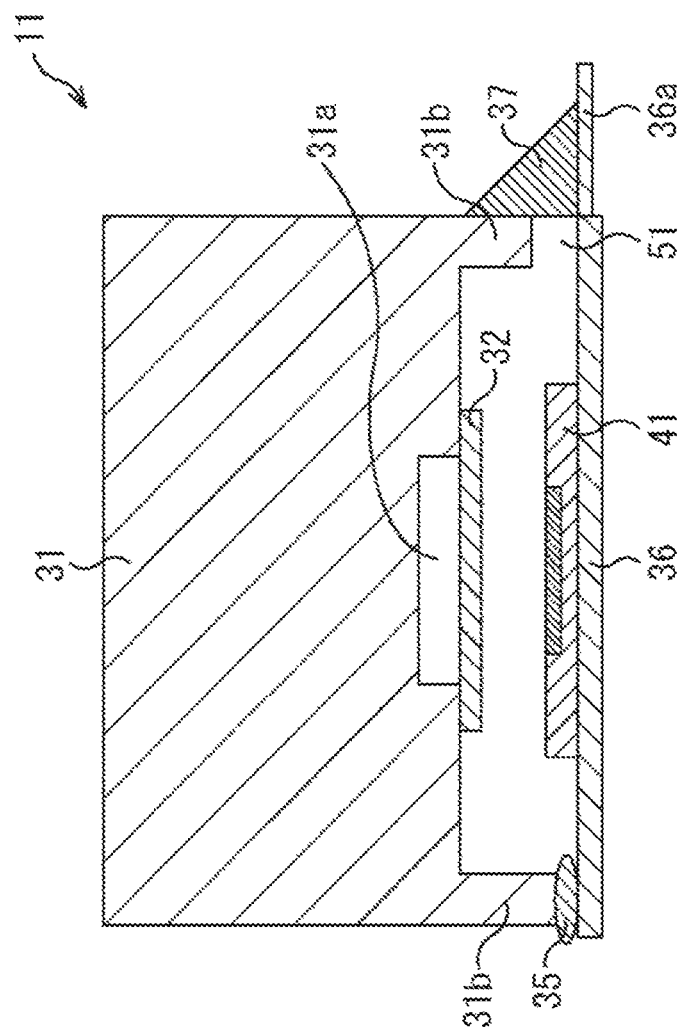
FIG. 15 is a diagram illustrating an exemplary configuration of a camera module according to a third embodiment of the present technology.

FIG. 15 illustrates an exemplary configuration of the camera module 11 in which the lens unit 31 and the rigid flexible substrate 36 are directly adhered to each other. Note that components of the camera module in FIG. 15, having same function as the function of the camera module in FIG. 2, will be given same terms and signs, and description thereof will be omitted as appropriate.

That is, the camera module 11 in FIG. 15 includes the lens unit 31 having a site equivalent to the configuration of the frame 34.

More specifically, the lens unit 31 in FIG. 15 includes a frame unit 31b corresponding to the configuration of the frame 34, at a site opposite to the rigid flexible substrate 36 in a lower portion of the diagram. The lens unit 31 is adhered to the rigid flexible substrate 36 by the frame resin 35. That is, the frame unit 31b is integrated with the lens unit 31.

Moreover, on the lens unit 31, an opening 31a equivalent of the opening 34a on the frame 34 is provided at a position opposite to the image sensor 41 in a lower portion of the diagram, and the IRCF 32 is provided so as to close the opening 31a.

At a portion of the side that comes in contact with the FPC drawer unit 36a being one side of four sides of the frame unit 31b, a slit-like vent hole 51 is formed between a frame unit 31a and the rigid flexible substrate 36.

As a result, even when the frame resin 35 on mutually abutting portion is heated to be cured to bond the frame unit 31b of the lens unit 31, with the rigid flexible substrate 36, it would be possible to discharge the expanded gas from the slit-like vent hole 51 formed at a portion of the abutting portion between the frame unit 31b and the rigid flexible substrate 36.

Moreover, by applying the reinforcement resin 37 so as to close the vent hole 51 after bonding the frame unit 31b of the lens unit 31, with the rigid flexible substrate 36 by curing the frame resin 35, it would be possible to omit a process of just applying the post sealing resin 38 to close the vent hole 51.

Note that, it would also achieve a similar effect also by using a configuration that corresponds to the above-described first to third modification examples by using the lens unit 11 including the frame unit 31b corresponding to the frame 34.

Fourth Embodiment

While the above describes an exemplary case where the lens unit 31 integrated with the frame 34 is directly adhered to the rigid flexible substrate 36, it would be also allowable to close the vent hole 51 provided on the frame unit 31a using an adhesive tape after completion of adhesion of the lens unit 31 integrated with the frame 34, with the rigid flexible substrate 36.

Figure 16:
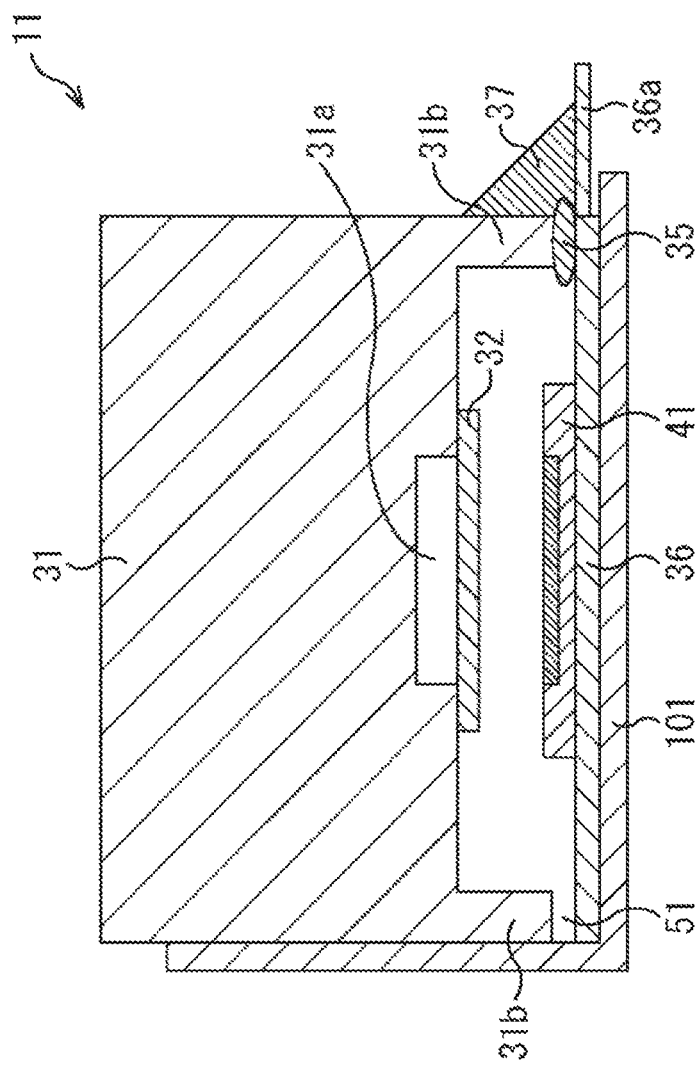
FIG. 16 is a diagram illustrating an exemplary configuration of a camera module according to a fourth embodiment of the present technology.

FIG. 16 illustrates an exemplary configuration of the camera module 11, in which, at curing of the frame resin 35 that connects the lens unit 31 integrated with the frame 34, with the rigid flexible substrate 36, the vent hole 51 is arranged at any portion of the connecting site, and the vent hole 51 is closed by the adhesive tape after completion of the adhesion of the lens unit 31 with the rigid flexible substrate 36. Note that components in FIG. 16, having same function as the function of the camera module in FIG. 9, will be given same terms and signs, and description thereof will be omitted as appropriate.

That is, the camera module 11 in FIG. 16 is configured such that the vent hole 51 is formed by providing a site on which the frame resin 35 is not applied at a portion of the side opposite to the side on which the reinforcement resin 37 is applied, among the end portions of the frame unit 31b, and that the site is further coated by an adhesive tape 101, similarly to the case of the camera module 11 in FIG. 9.

With this configuration, even when the frame resin 35 on mutually abutting portion is heated to be cured to bond the lens unit 31 with the rigid flexible substrate 36, it would be possible to discharge the expanded gas from the slit-like vent hole 51 formed at a portion of the abutting portion between the frame 34 and the rigid flexible substrate 36.

Moreover, the lens unit 31 and the rigid flexible substrate 36 are bonded with each other by curing of the frame resin 35, and thereafter, the adhesive tape 101 is attached so as to close the vent hole 51. With this configuration, even when a gap is generated that might break the air-tightness among the adhesive tape 101, the frame unit 31b, and the rigid flexible substrate 36, it would be possible to prevent dust from entering the space between the frame unit 31b and the rigid flexible substrate 36 by attracting and catching the dust using adhesiveness of the adhesive tape 101, and to suppress generation of a black spot.

Note that, in the description of the example in FIG. 16, the vent hole 51 formed by not applying the frame resin 35 is provided at a portion of the side opposite to the side on which the reinforcement resin 37 is applied. Alternatively, it is allowable to form the vent hole 51 formed by a portion of the side on which the reinforcement resin 37, or the like, is not applied in later processing, on other sites as long as it is a site on which the adhesive tape 101 is attached.

Note that it would also achieve a similar effect also using a configuration that corresponds to the above-described fourth to sixth modification examples by using the lens unit 11 including the frame unit 31b corresponding to the frame 34.

<Exemplary Application to Electronic Instrument>

The above-described camera module can be applied, for example, to various electronic instruments including imaging apparatuses such as a digital still camera and a digital video camera, a mobile phone having an imaging function, or other instrument having an imaging function.

Figure 17:
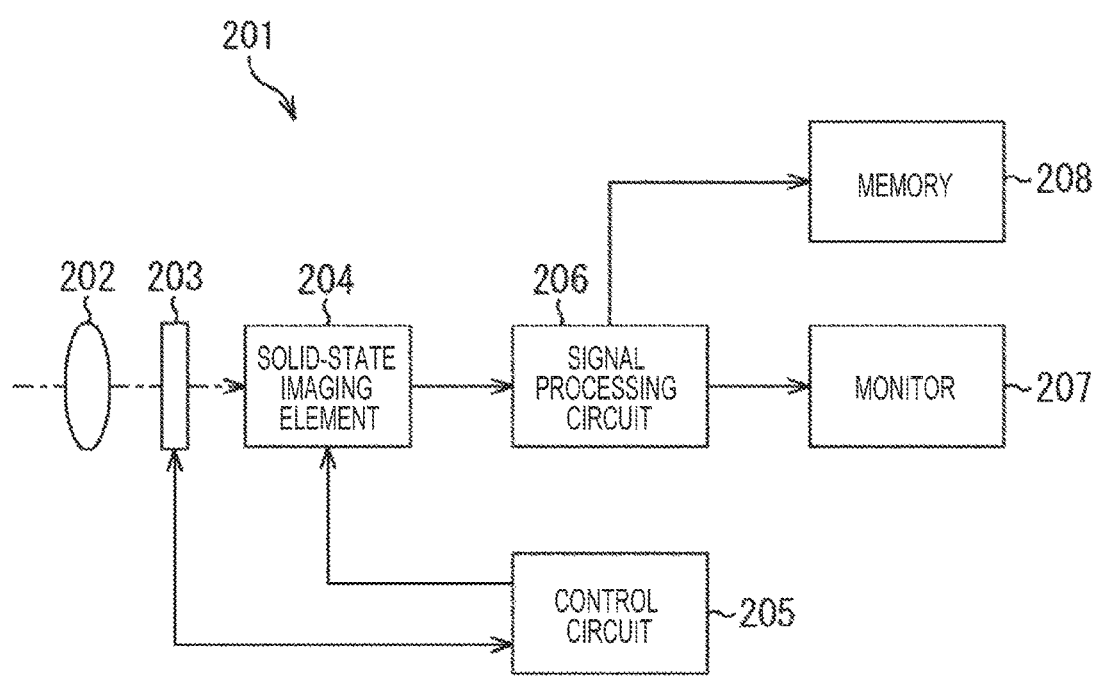
FIG. 17 is a diagram illustrating an exemplary configuration of an electronic instrument including the camera module according to the present technology.

FIG. 17 is a block diagram illustrating an exemplary configuration of an imaging apparatus as an electronic instrument of the present technology.

An imaging apparatus 201 illustrated in FIG. 17 includes an optical system 202, a shutter apparatus 203, a solid-state imaging element 204, a drive circuit 205, a signal processing circuit 206, a monitor 207, and a memory 208, and is capable of capturing a still image and a moving image.

The optical system 202 includes one or more lenses, guides the light (incident light) from a subject to the solid-state imaging element 204, and forms an image on a light receiving surface of the solid-state imaging element 204.

The shutter apparatus 203 is arranged between the optical system 202 and the solid-state imaging element 204 and controls light-emitting period and light-shielding period toward the solid-state imaging element 204 in accordance with the control by the drive circuit 205.

The solid-state imaging element 204 includes the above-described solid-state imaging element 1, or the solid-state imaging element 1. The solid-state imaging element 204 accumulates a signal charge for a fixed period of time according to the light that forms an image on the light receiving surface through the optical system 202 and the shutter apparatus 203. Signal charge stored in the solid-state imaging element 204 is transferred in accordance with the drive signal (timing signal) supplied from the drive circuit 205.

The drive circuit 205 drives the solid-state imaging element 204 and the shutter apparatus 203 by outputting a drive signal to control transfer operation of the solid-state imaging element 204 and shutter operation of the shutter apparatus 203.

The signal processing circuit 206 performs various types of signal processing on a signal charge output from the solid-state imaging element 204. The image (image data) obtained by signal processing by the signal processing circuit 206 is supplied to the monitor 207 and displayed, or supplied to the memory 208 and stored (recorded).

By applying the above-described camera module 11 also to the imaging apparatus 201 configured in this manner, it is possible to reduce the number of steps in the manufacturing process and simultaneously achieve prevention of stain deposition on the imaging element.

Note that the present technology may also be configured as below.

(1) A camera module including:
a lens unit;
a rigid flexible substrate equipped with a solid-state imaging element and bonded with a flexible print circuit (FPC) drawer unit; and
a frame that connects the lens unit with the rigid flexible substrate and includes an opening,
in which the frame and the rigid flexible substrate are adhered to each other by adhesive applied on an abutment surface excluding a portion of a range including a bonding section with the FPC drawer unit, and
reinforcement resin configured to reinforce a bonding section between the rigid flexible substrate and the FPC drawer unit or a bonding section between the rigid flexible substrate and the frame is applied so as to cover the portion of the range on which the adhesive has not been applied.

(2) The camera module according to (1),
in which a vent hole is formed in a space between the frame and the rigid flexible substrate by the range on which the adhesive has not been applied.

(3) The camera module according to (2),
in which the reinforcement resin is applied so as to close the vent hole.

(4) The camera module according to (2) or (3),
in which the vent hole has a range shorter than a length of a side of the frame that is rectangular.

(5) The camera module according to any of (2) to (4),
in which the vent hole is formed at a plurality of positions.

(6) The camera module according to any of (1) to (5),
in which the adhesive is one of UV thermosetting resin cured by emission of ultra violet (UV) together with heat, and thermosetting resin cured solely by heat.

(7) The camera module according to any of (1) to (6),
in which the reinforcement resin is one of UV curing resin cured by emission of ultra violet (UV), UV thermosetting resin cured by UV together with heat, and thermosetting resin cured solely by heat.

(8) The camera module according to any of (1) to (7),
in which the reinforcement resin is light-shielding resin.

(9) The camera module according to any of (1) to (8),
in which the reinforcement resin has an elasticity range of 100 MPa to 10000 MPa at 25° C.

(10) The camera module according to any of (1) to (9),
in which the adhesive is applied on any of a surface of the frame and a surface of the rigid flexible substrate, among abutment surfaces between the frame and the rigid flexible substrate.

(11) The camera module according to (1),
in which the rigid flexible substrate includes a substrate including a solid-state imaging element, and a flexible board including a drawer unit.

(12) The camera module according to (1),
in which a mold is included between the rigid flexible substrate and the frame.

(13) The camera module according to (1),
in which the frame is integrated with the lens unit.

(14) A method for manufacturing a camera module including:
a lens unit;
a rigid flexible substrate equipped with a solid-state imaging element and bonded with a flexible print circuit (FPC) drawer unit; and
a frame that connects the lens unit with the rigid flexible substrate and includes an opening,
in which the frame and the rigid flexible substrate are adhered to each other by adhesive applied on an abutment surface excluding a portion of a range including a bonding section with the FPC drawer unit, and thereafter,
reinforcement resin configured to reinforce a bonding section between the rigid flexible substrate and the FPC drawer unit or a bonding section between the rigid flexible substrate and the frame is applied so as to cover the portion of the range on which the adhesive has not been applied.

(15) An imaging apparatus including:
a lens unit;
a rigid flexible substrate equipped with a solid-state imaging element and bonded with a flexible print circuit (FPC) drawer unit; and
a frame that connects the lens unit with the rigid flexible substrate and includes an opening,
in which the frame and the rigid flexible substrate are adhered to each other by adhesive applied on an abutment surface excluding a portion of a range including a bonding section with the FPC drawer unit, and
reinforcement resin configured to reinforce a bonding section between the rigid flexible substrate and the FPC drawer unit or a bonding section between the rigid flexible substrate and the frame is applied so as to cover the portion of the range on which the adhesive has not been applied.

(16) An electronic instrument including:
a lens unit;
a rigid flexible substrate equipped with a solid-state imaging element and bonded with a flexible print circuit (FPC) drawer unit; and
a frame that connects the lens unit with the rigid flexible substrate and includes an opening,
in which the frame and the rigid flexible substrate are adhered to each other by adhesive applied on an abutment surface excluding a portion of a range including a bonding section with the FPC drawer unit, and
reinforcement resin configured to reinforce a bonding section between the rigid flexible substrate and the FPC drawer unit or a bonding section between the rigid flexible substrate and the frame is applied so as to cover the portion of the range on which the adhesive has not been applied.

REFERENCE SIGNS LIST 11 camera module
31 lens unit

32 IRCF
33 lens unit fastening resin
34 frame
34a opening
35 frame resin
36 rigid flexible substrate
36a FPC drawer unit
36b hole portion
37 reinforcement resin
38 post sealing resin
39 vent hole
40 adhesive
41 solid-state imaging element
51, 51-1, 51-2 vent hole
61 substrate
62 flexible board
71 mold
101 adhesive tape

The invention claimed is:

1. A camera module, comprising:
   a lens unit;
   a rigid flexible substrate;
   a solid-state imaging element on the rigid flexible substrate;
   a flexible print circuit (FPC) drawer unit adjacent to the rigid flexible substrate; and
   a frame that connects the lens unit with the rigid flexible substrate, wherein the frame includes an opening, wherein the frame is attached to the rigid flexible substrate by an adhesive applied on a first abutment surface, and wherein a portion, which includes a first bonding section with the FPC drawer unit adjacent to a second abutment surface between the frame and the rigid flexible substrate, excludes the adhesive,
   a reinforcement resin that reinforces at least one of the first bonding section between the rigid flexible substrate and the FPC drawer unit or a second bonding section between the rigid flexible substrate and the frame, wherein the reinforcement resin covers the portion on which the adhesive has not been applied.

2. The camera module according to claim 1, wherein a vent hole is in a space between the frame and the rigid flexible substrate at the second abutment surface.

3. The camera module according to claim 2, wherein the reinforcement resin closes the vent hole.

4. The camera module according to claim 2, wherein the vent hole is shorter than a side of the frame that is rectangular.

5. The camera module according to claim 2, wherein the vent hole is at a plurality of positions.

6. The camera module according to claim 1, wherein the adhesive is one of an ultra violet (UV) thermosetting resin curable by emission of UV together with heat or a thermosetting resin curable solely by heat.

7. The camera module according to claim 1, wherein the reinforcement resin is one of an ultra violet (UV) curing resin curable by emission of UV, UV thermosetting resin curable by UV together with heat or a thermosetting resin curable solely by heat.

8. The camera module according to claim 1, wherein the reinforcement resin is light-shielding resin.

9. The camera module according to claim 1, wherein the reinforcement resin has an elasticity range of 100 MPa to 10000 MPa at 25° C.

10. The camera module according to claim 1, wherein the adhesive is on one of a surface of the frame or a surface of the rigid flexible substrate.

11. The camera module according to claim 1, wherein the rigid flexible substrate includes a substrate and a flexible board, wherein the substrate is equipped with the solid-state imaging element, and wherein the flexible board includes a drawer unit.

12. The camera module according to claim 1, wherein a mold is included between the rigid flexible substrate and the frame.

13. The camera module according to claim 1, wherein the frame is integrated with the lens unit.

* * * * *